United States Patent [19]

Doemens et al.

[11] Patent Number: 4,967,149
[45] Date of Patent: Oct. 30, 1990

[54] DRIVE DEVICE FOR AN APPARATUS FOR ELECTRICAL FUNCTION TESTING OF WIRING MATRICES

[75] Inventors: Guenter Doemens, Holzkirchen; Thomas Rose; Detlef Hoffmann, both of Munich; Arnold Heisen, Garching, all of Fed. Rep. of Germany

[73] Assignee: Siemens Aktiengesellschaft, Berlin and Munich, Fed. Rep. of Germany

[21] Appl. No.: 286,347

[22] Filed: Dec. 19, 1988

[30] Foreign Application Priority Data

Dec. 21, 1987 [DE] Fed. Rep. of Germany ....... 3743390

[51] Int. Cl.$^5$ ............................................. G01R 31/02
[52] U.S. Cl. .............................. 324/158 F; 324/158 P; 324/500; 324/523
[58] Field of Search ................. 324/73 PC, 158 F, 51, 324/500, 514, 523, 158 R

[56] References Cited

U.S. PATENT DOCUMENTS

| 4,507,605 | 3/1985 | Geisel | 324/73 PC |
| 4,600,878 | 7/1986 | Doemens et al. | 324/73 PC |
| 4,705,329 | 11/1987 | Doemens | 324/73 PC |
| 4,777,432 | 10/1988 | Doemens et al. | 324/73 PC |

FOREIGN PATENT DOCUMENTS

| 0107771 | 5/1984 | European Pat. Off. . |
| 0216135 | 4/1987 | European Pat. Off. . |
| 0218058 | 4/1987 | European Pat. Off. . |

OTHER PUBLICATIONS

"Open/Short Testing" by T. Bayer et al, in IBM Technical Disclosure Bulletin, vol. 27, No. 4A, Sep. 1984, pp. 2024–2025.
"Gas Discharge Device to Test for Signal Plane to Signal Plane Incipient Shorts in Drilled but Unplated Circuit Card Boards" in IBM Technical Bulletin, vol. 29, No. 1, Jun., 1986, pp. 305–307.

Primary Examiner—Reinhard J. Eisenzopf
Assistant Examiner—Vinh P. Nguyen
Attorney, Agent, or Firm—Hill, Van Santen, Steadman & Simpson

[57] ABSTRACT

A drive device for an apparatus for electrical function testing of wiring matrices, which has optimally simple electrode shapes for the purpose of a further miniaturization with a two-electrode arrangement. For testing printed circuit boards a non-touching plasma contacting is used whereby two respectively selected measuring locations of a wiring matrix can be contacted via allocated discharge channels and their electrodes. The drive of the measuring locations (test points) occurs via control gas discharges that are generated by applying an adequately high voltage between the electrodes. By applying a voltage between the gas discharges, a current conduction that can be evaluated for test purposes is generated for a conductive connection between the test points.

9 Claims, 1 Drawing Sheet

DRIVE DEVICE FOR AN APPARATUS FOR ELECTRICAL FUNCTION TESTING OF WIRING MATRICES

BACKGROUND OF THE INVENTION

The present invention is directed to a drive device for an apparatus for electrical function testing of wiring matrices, particularly of printed circuit boards, having a carrier plate located over the wiring matrices and having a plurality of gas discharge channels each provided with at least first and second electrodes. At least two selected measuring locations (test points) of a wiring matrix are contactable via the allocated gas channels and their electrodes, respectively, whereby every channel being equipped with at least two electrodes is selectable based on a coincidence principle via a plurality of first and second electrode bus lines allocated to these electrodes. First electrodes of the channels are connected to one another in series via the first electrode bus lines and second electrodes of the channels are connected in series to one another via the second electrode bus lines.

European patent document EP-A-0 102 565 discloses a means for electrical function testing of wiring matrices wherein previously standard ohmic contacting of the measuring locations is replaced by non-touching plasma contacting via gas discharge paths. To this end, a plurality of gas discharge channels provided with electrodes are positioned in a carrier plate that can be placed on the wiring matrices. The gas discharge channels arranged in the framework of the wiring matrices are open toward the measuring locations. When, for example, two selected measuring locations are then connected to one another by an electrically conductive interconnect, then the allocated gas discharge channels form two series-connected gas discharge paths that can be ignited by applying an adequately high voltage to the electrodes. A current flow then occurs with the ignition of the gas discharges, this current flow being capable of being interpreted for testing purposes. When the ignition of the gas discharge fails to occur or when an excessively low current flows after an ignition, then it can be concluded that there is an interrupted connection between the selected measuring locations or a connection therebetween did not originally exist. The prior art apparatus thus provides conductivity and insulation measurements, whereby an extremely high reliability is achieved by avoiding ohmic contacts.

In automatic testing units and PC board adapters for unequipped and equipped printed circuit boards as well as for wiring matrices using solder or crimp technology the plurality of measuring locations can amount, for example, to a hundred thousand. Both in the use of resilient test probes as well as ionic contacting via gas discharge paths, the plurality of required leads and switch elements increases with the plurality of measuring locations, whereby a considerable complexity of apparatus and correspondingly high costs result. In order to reduce the plurality of terminals, a prior art arrangement has every gas discharge channel equipped with at least two non-insulated electrodes, whereby one electrode assumes the function of a grating (European patent document EP-A-0 218 058). Only the selection of both electrodes effects an ignition and/or burning of the gas discharges to the printed circuit board, in contrast the ignition and/or burning of a gas discharge from one electrode to the interconnect can be prevented by the other electrode, that is, the grating electrode. When the first electrodes of the gas discharge channels are connected in series via first electrode bus lines and the second electrodes, the grating electrodes, are connected to one another via second bus lines, then the two families of bus lines can be advantageously positioned at a relative angle of 45°.

In this prior art arrangement, a voltage that is adequate to ignite two series-connected discharges is applied between the upper electrode bus lines that are associated with the two test points. In addition, voltages are applied to the lower electrode bus lines that provide an ignition of the upper bus lines connected to a voltage at test points only at the desired measuring points and prevent all other ignitions, whereby no discharge can occur between the two electrodes of one channel.

SUMMARY OF THE INVENTION

In such a two-electrode arrangement, the present invention is based on an object of providing optimally simple electrode shapes and thus allowing for a further, simple miniaturization. The electrodes and the appertaining bus lines are preferably composed of an electrically conductive wire. In contrast to the prior art arrangement, a discharge between the electrodes that belong to a selected measuring location occur in the present invention.

The object is achieved by a voltage ($U_{z1}$) being applied to a first electrode bus line ($O_1$) and to a second electrode bus line ($U_1$) for a first selected channel. This voltage ($U_{z1}$) is adequate to ignite a gas discharge between the first and second electrode bus lines ($O_1$, $U_1$) in the selected channel. A voltage ($U_{z2}$) is applied to the first electrode bus line ($O_2$) and to the second electrode bus line ($U_2$) for a second selected channel. The voltage ($U_{z2}$) is adequate to ignite a gas discharge between these first and second electrode bus lines ($O_2$, $U_2$) in the second selected channel. For testing for a conductive connection between the first and second channels, a difference ($U_p$) in potential is applied between the gas discharges. This difference in potential ($U_p$) effects a current conduction ($I_p$) from the gas discharge between the first and second electrode lines ($O_1 U_1$) in the first channel to gas discharge between the first and second electrode lines ($O_2 U_2$) in the second channel via conductive connection between the two selected measuring locations when a conductive connection exists.

For driving a test point, a control gas discharge is ignited in the present invention between the two electrodes belonging thereto. When the electrical connection is to be tested between two test points, then both corresponding control gas discharges have potentials applied which are different from one another. For an existing electrical connection, a current conduction occurs from one gas discharge via the connection to the second gas discharge and this can be evaluated for testing purposes.

A greater freedom of selection in the design of the electrode shape exists with the drive means of the present invention.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
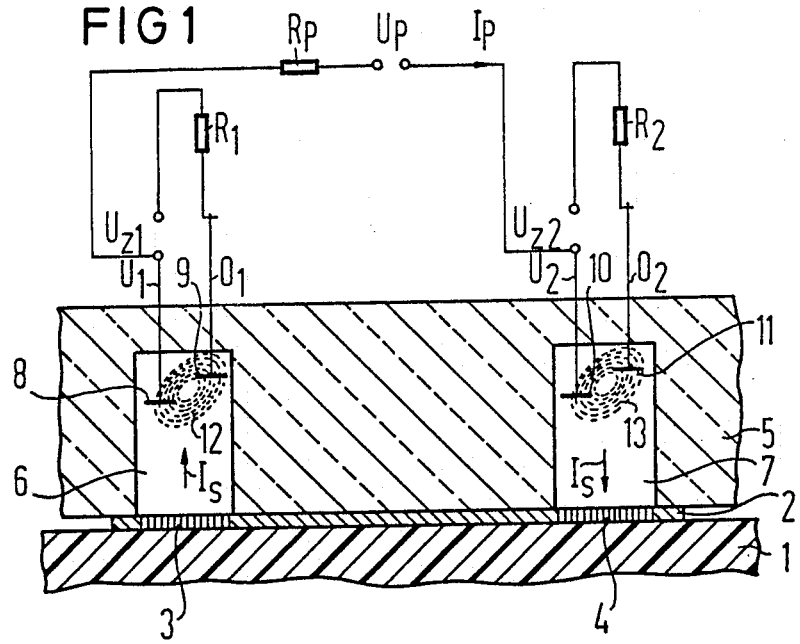
FIG. 1 is a cross-sectional view depicting the principle of a drive means for electrical function testing.

In a greatly simplified, schematic illustration, FIG. 1 shows the functioning of a drive means for a device for electrical function testing of wiring matrices, particularly of printed circuit boards, on the basis of a non-touching plasma contacting of measuring locations (test points). One part of the printed circuit board 1 may be seen in this figure, the ends of an interconnect 2 forming measuring locations 3 and 4 on an upper side thereof. A carrier plate 5 of insulating material, for example glass, into which a multitude of gas discharge channels are introduced in the form of blind holes is put in place on the upper side of the printed circuit board 1. Only the gas discharge channel 6 allocated to the measuring location 3 and the gas discharge channel 7 allocated to the measuring location 4 are shown in FIG. 1. Electrodes 8 and 9 are located in the gas discharge channel 6, whereby the electrode 8 is positioned more deeply than the electrode 9. Electrodes 10, 11 are located in the gas discharge channel 7, whereby the electrode 10 is again positioned more deeply, i.e. at the same level as the electrode 8. The dotted lines 12, 13 between the electrodes indicate the gas discharge. The appertaining, upper bus lines are references $O_1$ and $O_2$ and the lower bus lines are referenced $U_1$ and $U_2$. $U_{z1}$ and $U_{z2}$ indicate control voltages, which may be identical or different, that trigger the control gas discharges in the channels. $U_p$ references a test voltage and $I_p$ references a test current. $R_1$, $R_2$ and $R_p$ reference drop resistors with which the desired operating points are to be set.

Figure 2:
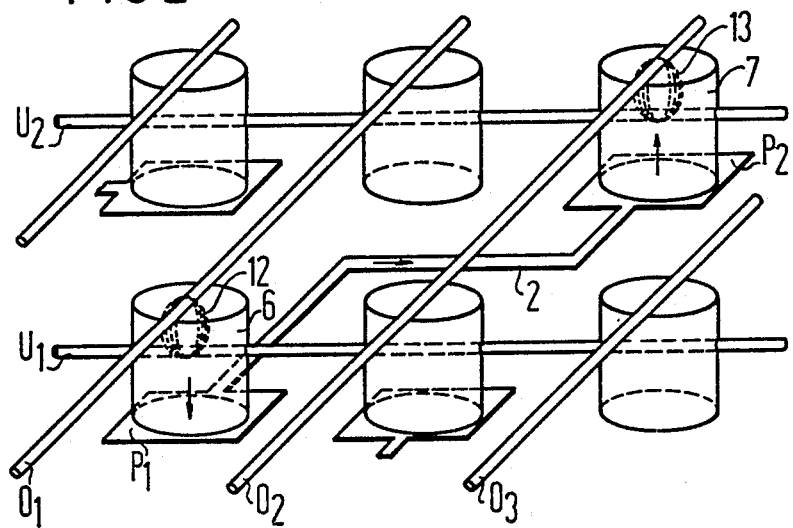
FIG. 2 is a perspective view showing six selected test points having drive electrodes.

The upper electrode bus lines are referenced $O_1$, $O_2$ and $O_3$ in FIG. 2 and the lower electrode bus lines are referenced $U_1$ and $U_2$. P1 and P2 designate two test points (measuring locations) on the interconnect 2.

When, for example, in FIG. 2, the test points $P_1$ and $P_2$ are to be investigated, then the following voltages are first applied:

| Electrode | Volts |
| --- | --- |
| $U_1$ | 0 |
| $U_2$ | $U_{z2}$ |
| $O_1$ | $U_{z1}$ |
| $O_2$ | 0 |

A voltage $U_{z1}$ or $U_{z2}$ that causes the ignition of a gas discharge is applied to the electrodes via $P_1$ and $P_2$. No difference in potential or only a slight difference in potential exists at the intersections of $O_1$ and $U_2$ and of $O_2$ and $U_1$. When, for example, the voltage at $U_1$ and $O_1$ is now varied by the same amount $U_p$, then the voltage differences via $P_1$ and $P_2$ do not change. However, a difference in potential is generated between $P_1$ and $P_2$, causing a current conduction of the gas discharges via the interconnect 2 for a conductive connection between $P_1$ and $P_2$. $U_p < U_{z1,2}$ thereby applies otherwise gas discharges would be ignited at undesired locations.

When testing a printed circuit board having N interconnects (and, for the sake of simplicity, exactly two end points per interconnect to be tested), N measurements are required for the "transit test". If, in the insulation test, every interconnect had to be individually checked for shorts or shunts to every other interconnect, then $\frac{1}{2} \cdot N \cdot (N-1)$ measurements would be required. The consequence would be extremely long measuring times.

Since a parallel connection of many control gas discharges is not physically possible, the insulation of one interconnect from all other interconnects cannot be simultaneously tested with the methods set forth above.

However, the test of "one relative to all" can be realized with the above-described arrangement for the methods set forth below, whereby the insulation test of one interconnect relative to all others is possible in one step. The insulation test then also requires only N measurements.

When, for example, $P_1$ is to be tested for insulation from all other interconnects, then a voltage is applied between $U_1$ and all other lower electrodes $U_1$ that lie over points to be tested and not via the interconnect belonging to $P_1$, this voltage in fact sufficing to maintain a gas discharge that is already ignited but not being adequate for an independent ignition. When a voltage of a magnitude and polarity that produces an ignition only between $O_1$ and $U_1$ and nowhere else is then applied to $O_1$ a gas discharge is ignited between the electrodes via $P_1$. This causes a current surge at test point $P_1$ and, thus, at every point $P_1$ conductively connected thereto. This causes an ignition between the test point $P_1$ and the lower electrode situated thereabove. An undesired conductive connection between the permanently selected test point $P_1$ and some other point $P_1$ that was previously not specified can be identified in this fashion. Thus, for N interconnects, only N-insulation measurements are required. As needed, this short can then be localized by further measurements wherein $P_1$ is no longer tested for shorts relative to all of the test points but only relative to one-half thereof (one-fourth thereof, etc.). The additional number of measurements then approximately corresponds to the two's logarithm from the number 1d (N) of interconnects.

For example, in the embodiment shown in FIG. 2, an aluminum wire having a diameter of 3 mm was used for the upper electrode bus lines $O_1$, $O_2$ and $O_3$ and for the lower electrode bus line $U_1$ and $U_2$. The distance between the level having the upper electrode bus lines and the level having the lower electrode bus lines is 25 mm. The distance between the wire axes of the lower electrode bus lines and the level having the interconnect 2 and the test points $P_1$ and $P_2$ is 10 mm. The diameter of the gas discharge channels 6 and 7 as well as of the other gas discharge channels (not referenced) is 3 mm. The overall arrangement was thereby situated in a helium atmosphere having a pressure of 25 mbar.

The test occurred with the following electrical parameters, whereby the designations may be in part derived from FIG. 1.

drop resistor $R_1 = 400$ k ohm
drop resistor $R_2 = 400$ k ohm
drop resistor $R_p = 10$ k ohm
Maintaining voltage between $U_1$ and $O_1$ (potential - free) of 450 V; $U_1$ positive relative to $O_1$ maintaining current of 1.3 mA; Maintaining voltage between $U_2$ and $O_2$ (potential - free) of 450 V; $U_2$ negative relative to $O_2$ maintaining current of 1.3 mA; and Test voltage between $U_1$ and $U_2$ (potential - free) of 200 V, $U_2$ positive in comparison to $U_1$. For an electrically conductive connection between the test points $P_1$ and $P_3$ via the interconnect 2, a test current $I_p=0.6$ mA was measured. However, with an interrupted interconnect 2, the test current $I_p=0$.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A drive device for electrical function testing of wiring matrices, particularly of printed circuit boards, having a carrier plate located over the wiring matrices the carrier plate having a plurality of gas discharge channels each provided with at least first and second electrodes, whereby at least two selected measuring locations (test points) of a wiring matrix are contactable via the allocated gas channels and their electrodes, respectively, whereby every channel being equipped with at least two electrodes is selectable based on a coincidence principle via a plurality of first and second electrode bus lines allocated to these electrodes, first electrodes of the channels being connected in series via the first electrode bus lines and second electrodes of the channels being connected in series via the second electrode bus lines, comprising a voltage ($U_{z1}$) being applied to a first electrode bus line ($O_1$) and to a second electrode bus line ($U_1$) for a first selected channel, this voltage ($U_{z1}$) being adequate to ignite a gas discharge between the first and second electrode bus lines ($O_1$, $U_1$) in the first selected channel; and further, a voltage ($U_{z2}$) being applied to the first electrode bus line ($O_2$) and to the second electrode bus line ($U_2$) for a second selected channel, the voltage ($U_{z2}$) being adequate to ignite a gas discharge between the first and second electrode bus lines ($O_2$, $U_2$) in the second selected channel; and, for testing for a conductive connection between the first and second channels, a difference ($U_p$) in potential being applied between the gas discharges, this difference in potential ($U_p$) effecting a current conduction ($I_p$) from the gas discharge between the first and second elected bus liens ($O_1$, $U_1$) in the first channel to the gas discharge between the first and second electrode bus lines ($O_2$, $U_2$) in the second channel via conductive connection between the two selected measuring locations when a conductive connection exists.

2. The drive device according to claim 1, wherein the first and second electrodes in each of the channels and the electrode bus lines are composed of an electrically conductive wire.

3. The drive device according to claim 1, wherein the first electrodes in each of the channels and the second electrodes in each of the channels are positioned at different height levels in the gas discharge channels.

4. The drive device according to claim 1, wherein the first plurality of electrode bus lines and the plurality of second electrode bus lines are arranged intersecting one another.

5. The drive device according to claim 1, wherein all gas discharge channels are chargeable with our ionizing radiation.

6. The drive device according to claim 1 for testing a test point ($P_1$) for insulation from all other interconnects, having a gas discharge being ignited between the first and second electrode bus lines in the gas discharge channel allocated to the test point and a voltage ($U_p$) being applied between all second electrode bus lines which are lower than all first electrode bus lines and that lie over points to be tested and not over the interconnect belonging to the test point ($P_1$) and the control gas discharge in the gas discharge channel allocated to the test point ($P_1$), said voltage ($U_p$) being adequate for an existing, conductive connection between said test point ($P_1$) and any other test point ($P_2-P_n$) in order to ignite a gas discharge between the appertaining, second electrode bus line and the test point ($P_1$), so that a current conduction from this electrode is effected to the control gas discharge via the gas discharge and the conductive connection.

7. The drive device according to claim 1, wherein the discharge channels are arranged with a grid dimension that is standard for printed circuit board technology.

8. The drive device according to claim 1, wherein the carrier plate is rotatable by 90° relative to the wiring matrix to be tested and the tests can be carried out in both positions.

9. The drive device according to claim 1, wherein the selected measuring locations are contactable by a plasma.

* * * * *